(12) United States Patent
Long

(10) Patent No.: US 11,244,606 B2
(45) Date of Patent: Feb. 8, 2022

(54) DISPLAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/768,555

(22) PCT Filed: Nov. 8, 2019

(86) PCT No.: PCT/CN2019/116629
§ 371 (c)(1),
(2) Date: May 29, 2020

(87) PCT Pub. No.: WO2020/094126
PCT Pub. Date: May 14, 2020

(65) Prior Publication Data
US 2020/0294446 A1    Sep. 17, 2020

(30) Foreign Application Priority Data
Nov. 8, 2018 (CN) .......................... 201821835171.6

(51) Int. Cl.
*G09G 3/32* (2016.01)
*G09G 3/3225* (2016.01)
*H01L 27/32* (2006.01)

(52) U.S. Cl.
CPC ....... *G09G 3/3225* (2013.01); *H01L 27/3258* (2013.01)

(58) Field of Classification Search
CPC ... G09G 2300/0426; G09G 2300/0819; G09G 2300/0842; G09G 2300/0861;
(Continued)

(56) References Cited
U.S. PATENT DOCUMENTS 10,229,964 B2 * 3/2019 Kim .................... H01L 27/3276
2006/0192492 A1   8/2006 Ushifusa et al.
(Continued)

FOREIGN PATENT DOCUMENTS

CN    1822738 A    8/2006
CN    107665909 A  2/2018
(Continued)

Primary Examiner — Tony O Davis
(74) Attorney, Agent, or Firm — Nath, Goldberg & Meyer; Joshua B. Goldberg

(57) ABSTRACT

The present disclosure provides a display substrate and a method for manufacturing the same, and a display device. The display substrate includes: a base substrate; a first pattern layer, a second pattern layer and a third pattern layer on the base substrate, the third pattern layer is arranged on the base substrate, the first pattern layer is arranged on the third pattern layer, and the second pattern layer is arranged on the first pattern layer, the first pattern layer comprises at least one auxiliary metal line, the second pattern layer comprises at least one power line, and the third pattern layer comprises multiple rows and columns of second electrodes arranged in an array.

20 Claims, 7 Drawing Sheets

(58) Field of Classification Search
CPC ............... G09G 3/3225; G09G 3/3233; H01L 2227/323; H01L 27/3258; H01L 27/3265; H01L 27/3276; H01L 27/3279
USPC .......................................... 1/1; 345/170–178
See application file for complete search history.

(56) References Cited

U.S. PATENT DOCUMENTS

| | | | |
|---|---|---|---|
| 2017/0221979 A1* | 8/2017 | Chae | H01L 27/3262 |
| 2017/0249896 A1* | 8/2017 | Kim | H01L 27/124 |
| 2018/0005585 A1* | 1/2018 | Kim | H01L 27/3223 |
| 2018/0082630 A1* | 3/2018 | Kim | H01L 27/3223 |
| 2018/0090061 A1* | 3/2018 | Kim | G09G 3/3233 |
| 2018/0151663 A1* | 5/2018 | Kim | H01L 27/3223 |
| 2018/0240856 A1* | 8/2018 | Kim | H01L 27/3276 |

FOREIGN PATENT DOCUMENTS

| | | |
|---|---|---|
| CN | 108122928 A | 6/2018 |
| CN | 208753327 U | 4/2019 |

\* cited by examiner

DISPLAY SUBSTRATE AND MANUFACTURING METHOD THEREOF, DISPLAY DEVICE

CROSS-REFERENCE TO RELATED APPLICATIONS

This is a National Phase Application filed under 35 U.S.C. 371 as a national stage of PCT/CN2019/116629, filed Nov. 8, 2019, an application claiming the benefit of Chinese Application No. 201821835171.6, filed Nov. 8, 2018, the content of each of which is hereby incorporated by reference in its entirety.

TECHNICAL FIELD

The present disclosure relates to the field of display technology, and in particular, to a display substrate, a method for manufacturing the display substrate, and a display device including the display substrate.

BACKGROUND

A display substrate generally includes a plurality of pixel units, each of which has a pixel circuit therein. By supplying a signal to the pixel circuit in each pixel unit, the pixel unit can be driven to emit light.

SUMMARY

According to an embodiment of the present disclosure, there is provided a display substrate including: a base substrate; and a first pattern layer, a second pattern layer and a third pattern layer on the base substrate, the third pattern layer is arranged on the base substrate, the first pattern layer is arranged on the third pattern layer, and the second pattern layer is arranged on the first pattern layer, the first pattern layer includes at least one auxiliary metal line, the second pattern layer includes at least one power line, and the third pattern layer includes multiple rows and columns of second electrodes arranged in an array, one of the at least one auxiliary metal line is arranged corresponding to one row of the multiple rows and columns of second electrodes and partially overlaps with at least one of the second electrodes in the one row to form at least one storage capacitor, and the one auxiliary metal line is electrically coupled to the at least one power line through a via hole.

According to an embodiment of the present disclosure, a width of an overlapping portion of the auxiliary metal line overlapping with the second electrode is larger than a width of a remaining portion of the auxiliary metal line except the overlapping portion, and the overlapping portion serves as a first electrode of the storage capacitor.

According to an embodiment of the present disclosure, the auxiliary metal line has a protrusion at a position corresponding to the second electrode, and the protrusion serves as the first electrode of the storage capacitor.

According to an embodiment of the present disclosure, an extending direction of the at least one power line is parallel to a column direction of the multiple rows and columns of second electrodes, an extending direction of the at least one auxiliary metal line is parallel to a row direction of the multiple rows and columns of second electrodes, and the extending direction of the at least one power line is perpendicular to the extending direction of the at least one auxiliary metal line.

According to an embodiment of the present disclosure, the second pattern layer further includes a plurality of data lines, the third pattern layer further includes a plurality of gate lines, an extending direction of the at least one power line is parallel to an extending direction of the plurality of data lines, and an extending direction of the at least one auxiliary metal line is parallel to an extending direction of the plurality of gate lines.

According to an embodiment of the present disclosure, the first pattern layer further includes at least one reset signal line arranged in a same layer as the at least one auxiliary metal line.

According to an embodiment of the present disclosure, the first pattern layer further includes an interlayer insulating layer arranged on the at least one auxiliary metal line, and each of the at least one auxiliary metal line is electrically coupled to the at least one power line through a via hole in the interlayer insulating layer.

According to an embodiment of the present disclosure, the at least one power line and the plurality of data lines in the second pattern layer are arranged on the interlayer insulating layer.

According to an embodiment of the present disclosure, the third pattern layer further includes: a second gate insulating layer on the multiple rows and columns of second electrodes and the plurality of gate lines, the at least one auxiliary metal line being arranged on the second gate insulating layer.

According to an embodiment of the present disclosure, the display substrate further includes: an active layer arranged on the base substrate; and a first gate insulating layer arranged on the active layer and an exposed part of the base substrate, the multiple rows and columns of second electrodes and the plurality of gate lines being arranged on the first gate insulating layer.

According to an embodiment of the present disclosure, the display substrate is divided into a plurality of pixel units by the multiple rows and columns of second electrodes arranged in an array, the at least one auxiliary metal line includes a plurality of auxiliary metal lines, the at least one power line includes a plurality of power lines, the plurality of auxiliary metal lines are respectively electrically coupled to the plurality of power lines through via holes, and the plurality of auxiliary metal lines are respectively arranged corresponding to the multiple rows of second electrodes and partially overlap with each of second electrodes in the corresponding rows of second electrodes to form a plurality of storage capacitors, each of the plurality of pixel units is provided therein with a pixel circuit and an organic light-emitting diode, the pixel circuit includes a driving transistor, a data writing transistor, a first light-emitting control transistor, a second light-emitting control transistor, a reset transistor, a compensation sub-circuit, and a storage capacitor of the plurality of storage capacitors, a second electrode of the storage capacitor being a gate of the driving transistor in the pixel unit in which the storage capacitor is located, a source of the driving transistor is electrically coupled to a drain of the first light-emitting control transistor, and a drain of the driving transistor is electrically coupled to a source of the second light-emitting control transistor; a source of the first light-emitting control transistor is electrically coupled to one of the plurality of power lines, and the gate of the first light-emitting control transistor is electrically coupled to a light-emitting control signal line; a drain of the second light-emitting control transistor is electrically coupled to an anode of the organic light-emitting diode, and a gate of the second light-emitting control transistor is electrically coupled to the light-emitting control signal line; a source of the reset transistor is electrically coupled to the reset signal line, a drain of the reset transistor is electrically coupled to the gate electrode of the driving transistor, and the gate of the reset transistor is electrically coupled to a reset control signal line; a source of the data writing transistor is electrically coupled to one of the plurality of data lines, a drain of the data writing transistor is electrically coupled to the source of the driving transistor, a gate of the data writing transistor is electrically coupled to one of the plurality of gate lines, and the data writing transistor is configured to be conductive between the source and drain of the data writing transistor when the gate of the data writing transistor receives a valid control signal; a first terminal of the compensation sub-circuit is electrically coupled to the gate of the driving transistor, a second terminal of the compensation sub-circuit is electrically coupled to the drain of the driving transistor, a control terminal of the compensation sub-circuit is electrically coupled to the gate of the data writing transistor, and the compensation sub-circuit is configured to cause the drain and the gate of the driving transistor to be electrically coupled to each other when the control terminal of the compensation sub-circuit receives a valid control signal, so that the storage capacitor stores a threshold voltage of the driving transistor.

According to an embodiment of the present disclosure, the compensation sub-circuit includes a first compensation transistor and a second compensation transistor, a gate of the first compensation transistor is electrically coupled to a gate of the second compensation transistor, and serves as the control terminal of the compensation sub-circuit; a source of the first compensation transistor is electrically coupled to a drain of the second compensation transistor, a drain of the first compensation transistor serves as the second terminal of the compensation sub-circuit and is electrically coupled to the drain of the driving transistor, and a source of the second compensation transistor serves as the first terminal of the compensation sub-circuit and is electrically coupled to the gate of the driving transistor.

According to an embodiment of the present disclosure, the display substrate further includes a buffer layer formed on the base substrate, the active layer being formed on the buffer layer.

According to an embodiment of the present disclosure, the base substrate is made of a polyurethane material, the active layer is made of a polycrystalline silicon material, and the buffer layer is made of silicon oxide and/or silicon nitride.

According to an embodiment of the present disclosure, there is provided a display device including the display substrate above.

According to an embodiment of the present disclosure, there is provided a method for manufacturing a display substrate, the display substrate including a third pattern layer, a first pattern layer and a second pattern layer sequentially arranged on a base substrate, the method including: forming the third pattern layer including: forming multiple rows and columns of second electrodes arranged in an array on the base substrate; and forming a second gate insulating layer on the multiple rows and columns of second electrodes and on an exposed part of the base substrate, forming the first pattern layer including: forming at least one auxiliary metal line on the second gate insulating layer, such that one of the at least one auxiliary metal line is arranged corresponding to one row of the multiple rows and columns of second electrodes and partially overlaps with at least one of the second electrodes in the one row to form at least one storage capacitor; forming an interlayer insulating layer on the at least one auxiliary metal line; and forming a via hole extending to the at least one auxiliary metal line in the interlayer insulating layer, forming the second pattern layer including: forming at least one power line on the interlayer insulating layer, such that the at least one power line is electrically coupled to the at least one auxiliary metal line through the via hole in the interlayer insulating layer.

According to an embodiment of the present disclosure, before forming the third pattern layer, the method further includes: forming an active layer on the base substrate; forming a first gate insulating layer on the active layer and an exposed part of the base substrate, the multiple rows and columns of second electrodes arranged in an array being formed on the first gate insulating layer, and forming the first pattern layer further includes: forming at least one reset signal line while forming the at least one auxiliary metal line.

According to an embodiment of the present disclosure, the display substrate is divided into a plurality of pixel units by the multiple rows and columns of second electrodes arranged in an array, each of the plurality of pixel units includes a pixel circuit and an organic light-emitting diode, the pixel circuit includes a driving transistor, a data writing transistor, a first light-emitting control transistor, a second light-emitting control transistor, a reset transistor, a first compensation transistor, a second compensation transistor, and the storage capacitor, the forming the third pattern layer further includes: while forming the multiple rows and columns of second electrodes arranged in an array on the first gate insulating layer, forming a gate of the data writing transistor, a gate of the first light-emitting control transistor, a gate of the second light-emitting control transistor, a gate of the reset transistor, a gate of the first compensation transistor, a gate of the second compensation transistor, a plurality of gate lines, a light-emitting control signal line, and a reset control signal line on the first gate insulating layer, the second electrode of the storage capacitor serves as the gate of the driving transistor, such that the gate of the data writing transistor, the gate of the first compensation transistor, and the gate of the second compensation transistor are all electrically coupled to a same gate line among the plurality of gate lines, the gate of the first light-emitting control transistor and the gate of the second light-emitting control transistor are respectively electrically coupled to the light-emitting control signal line; and doping ions into the active layer to form source and drain regions of each transistor in a region of the active layer not blocked by the gate of each transistor and the multiple rows and columns of second electrodes as an ion implantation barrier layer, a source region of the driving transistor, a drain region of the first light-emitting control transistor, and a drain region of the data writing transistor are integrally formed in the active layer as a single piece; a drain region of the driving transistor, a source region of the second emitting control transistor, and a drain region of the first compensation transistor are integrally formed in the active layer as a single piece; a drain region of the reset transistor and a source region of the second compensation transistor are integrally formed in the active layer as a single piece; and a source region of the first compensation transistor and a drain region of the second compensation transistor are integrally formed in the active layer as a single piece.

According to an embodiment of the present disclosure, forming the second pattern layer further includes: forming via holes respectively extending to a source region of the first light-emitting control transistor, a drain region of the second light-emitting control transistor, the second electrode of the storage capacitor, a source region of the data writing transistor, the source region of the second compensation transistor, a source region of the reset transistor, and the reset signal line in the interlayer insulating layer; and while forming the at least one power line on the interlayer insulating layer, forming an electrical connection line between a drain of the second light-emitting control transistor, a plurality of data lines, an electrical connection line between a via hole extending to the second electrode of the storage capacitor and a via hole extending to a source region of the second compensation transistor, and an electrical connection line between a via hole extending to a source region of the reset transistor and a via hole extending to the reset signal line, such that one of the at least one power line, which is electrically coupled to one of the at least one auxiliary metal line, is electrically coupled to a source region of the first light-emitting control transistor through a via hole in the interlayer insulating layer.

BRIEF DESCRIPTION OF THE DRAWINGS

The drawings are used to provide a further understanding of the present disclosure, and constitute a part of the specification, together with the following embodiments to explain the present disclosure, but do not constitute a limitation to the present disclosure. In the drawings.

DETAILED DESCRIPTION

The specific embodiments of the present disclosure will be described in detail below with reference to the drawings. It should be understood that the specific embodiments described herein are only used to illustrate and explain the present disclosure, and are not intended to limit the present disclosure.

At present, when a display device operates to display, different pixel units thereon may not emit light uniformly, which affects the display effect. Therefore, how to improve the uniformity of light emission of the pixel units becomes an urgent technical problem to be solved in the art.

The inventors of the present disclosure have found that one reason of occurrence of non-uniform luminescence of a display device is as follows. A high-level voltage signal is provided to a pixel circuit in each pixel unit through a power line, and the power line has internal resistance, so that different high-level voltage signals may be received by the pixel units due to Internal Resistance Drop (IR Drop) of the power line when the high-level voltage signals are transmitted through the power line, thereby causing non-uniform luminescence of the pixel units and affecting the display effect.

Figure 1:
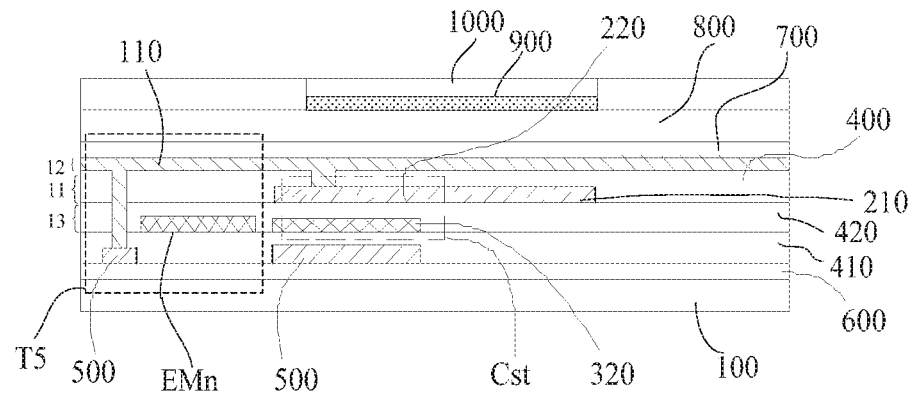
FIG. 1 is a cross-sectional view of a display substrate at positions of an organic light-emitting diode, a driving transistor, and a storage capacitor according to an embodiment of the present disclosure, and illustrates connection of an auxiliary metal line to a power line.

In view of this, the present disclosure provides a display substrate including a base substrate, and a first pattern layer, a second pattern layer, and a third pattern layer on the base substrate. As shown in FIG. 1 which is a cross-sectional view taken along a line a-a' of FIG. 5K, a third pattern layer 13 is on the base substrate 100, a first pattern layer 11 is on the third pattern layer 13, and a second pattern layer 12 is on the first pattern layer 11. The first pattern layer 11 includes at least one auxiliary metal line 210. The second pattern layer 12 includes at least one power line 110. The at least one auxiliary metal line 210 is electrically coupled to the at least one power line 110 through a via hole. The third pattern layer 13 includes multiple rows and columns of second electrodes 320 arranged in an array.

One of the at least one auxiliary metal line 210 is arranged corresponding to one raw of the multiple rows and columns of second electrodes 320, and partially overlaps with at least one of the second electrodes 320 in the one row to form at least one storage capacitor Cst, and the one auxiliary metal line 210 is electrically coupled to the at least one power line 110 through a via hole.

The display substrate may be divided into a plurality of pixel units arranged in an array by the multiple rows and columns of second electrodes 320 arranged in an array. Each column of pixel units may correspond to one power line, and thus, the number of at least one power line may be the same as the number of columns of pixel units. Alternatively, the number of the at least one auxiliary metal line may be the same as the number of rows of the pixel units.

The at least one power line 110 and the at least one auxiliary metal line 210 are electrically coupled to each other, which is equivalent to increasing the cross-sectional area of the power line, so that the resistance of the combined structure of the at least one power line 110 and the at least one auxiliary metal line 210 is smaller than the resistance of the power line 110 itself.

When a display device including the display substrate above operates to display, the power line 110 is electrically coupled to a DC power supply, and a high level voltage is supplied to the display substrate through the combined structure of the power lines smaller than that of the power lines 110, when the display device including the display substrate in the present disclosure operates to display, the Internal Resistance Drop (IR Drop) of the combined structure is smaller than that of the power lines 110 during the signal transmitting, so that the difference between high-level signals received by different pixel units can be reduced, and the uniformity of display can be improved.

In order to further improve the uniformity of the signals in transmission process, in some embodiments, an extending direction of the at least one power line 110 is perpendicular to an extending direction of the at least one auxiliary metal line 210. In a specific embodiment, orthographical projections of the power lines 110 and the auxiliary metal lines 210 on the display substrate form a grid.

In the present disclosure, when the display substrate is an organic light-emitting diode display substrate, the power line 110 is generally electrically coupled to a source of the light-emitting control transistor through a high-level signal terminal ELVDD. For a pixel circuit, since sources and drains of different transistors and data lines are usually arranged on a same layer, the power lines 110 and the data lines may be arranged on a same layer to simplify the manufacturing process and reduce a thickness of the display substrate in some embodiments. That is, the second pattern layer 12 further includes a plurality of data lines. In order to avoid short circuit between the power lines 110 and the data lines, in some embodiments, an extending direction of the at least one power line 110 is parallel to a column direction of the multiple rows and columns of second electrodes, an extending direction of the at least one auxiliary metal line 210 is parallel to a row direction of the multiple rows and columns of second electrodes, and the extending direction of the at least one power line 110 is perpendicular to the extending direction of the at least one auxiliary metal line 210.

As shown in FIG. 1, in some embodiments, the first pattern layer 11 further includes an interlayer insulating layer 400 arranged on the at least one auxiliary metal line 210. Each of the at least one auxiliary metal line 210 is electrically coupled to the at least one power line 110 through a via hole arranged in the interlayer insulating layer 400.

As shown in FIG. 1, in some embodiments, the at least one power line 110 and the plurality of data lines in the second pattern layer 12 are arranged on the interlayer insulating layer 400.

As shown in FIG. 1, in some embodiments, the third pattern layer 13 further includes a second gate insulating layer 420 arranged on the multiple rows and columns of second electrode 320 and a plurality of gate lines. The at least one auxiliary metal line 210 is arranged on the second gate insulating layer 420.

As shown in FIG. 1, in some embodiments, the display substrate further includes an active layer 500 and a first gate insulating layer 410. The active layer 500 is arranged on the base substrate 100. The first gate insulating layer 410 is arranged on the active layer 500 and an exposed part of the base substrate 100. The first gate insulating layer 410 is provided with the multiple rows and columns of second electrode 320 and a plurality of gate lines GATE thereon.

Figure 2:
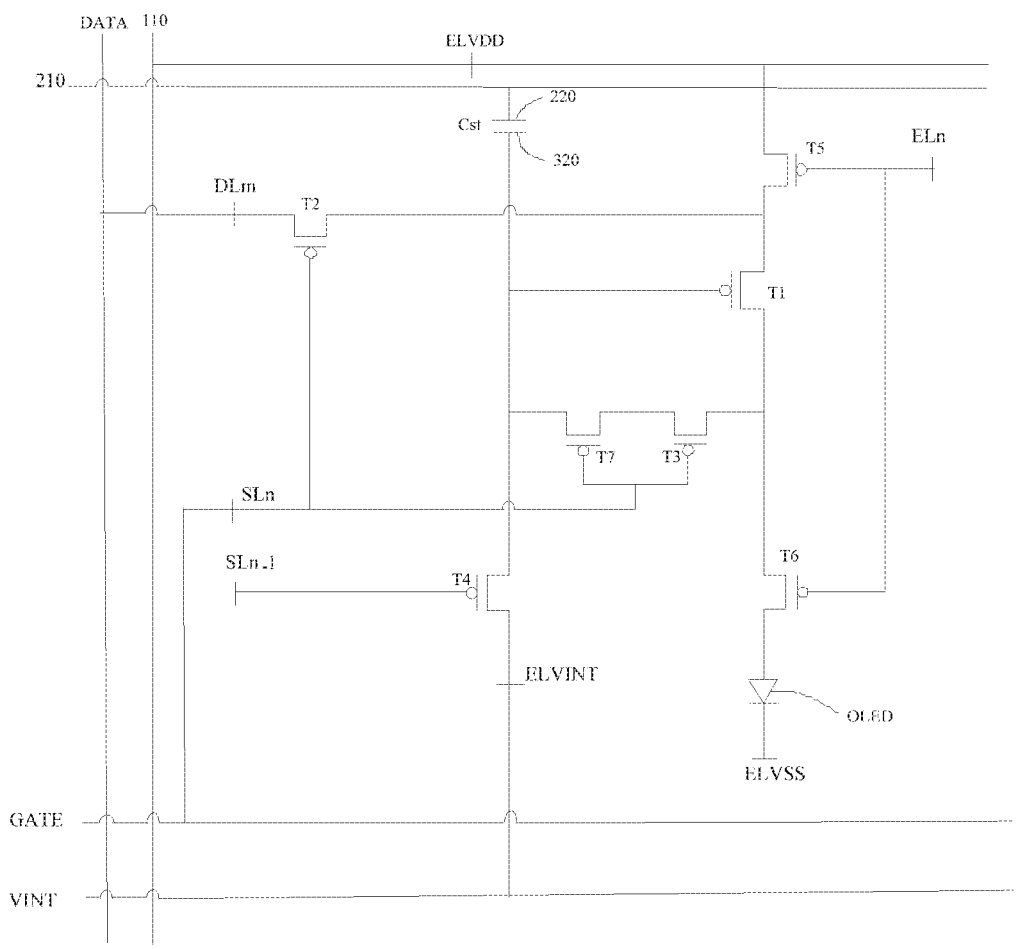
FIG. 2 is a schematic diagram of a pixel circuit on a display substrate according to an embodiment of the present disclosure.

For a display substrate including an organic light-emitting diode, the display substrate includes a plurality of pixel units, each including an organic light-emitting diode and a pixel circuit for driving the organic light-emitting diode to emit light. Accordingly, as shown in FIG. 2, the pixel circuit includes a driving transistor T1 and a storage capacitor Cst. The driving transistor T1 is used to generate a driving current, and the storage capacitor Cst is used to store a data voltage and a threshold voltage of the driving transistor T1. It should be noted that, the purpose of storing the threshold voltage of the driving transistor T1 is to compensate the threshold voltage of the driving transistor T1 when the organic light-emitting diode is driven to emit light, and to prevent the threshold voltage of the driving transistor T1 from affecting luminescence of the organic light-emitting diode.

In order to store the threshold voltage of the driving transistor T1, a first electrode of the storage capacitor Cst is electrically coupled to the power line 110 through the auxiliary metal line 210, and a second electrode of the storage capacitor Cst is electrically coupled to the gate of the driving transistor T1. In order to reduce a thickness of the display substrate, in some embodiments, a portion of the auxiliary metal line 210 may be used as the first electrode of the storage capacitor Cst (in the embodiment shown in FIG. 5E, the auxiliary metal line 210 may protrude at a position corresponding to the second electrode of the storage capacitor Cst, and the protrusion may be used as the first electrode 220 of the storage capacitor Cst). That is, the portion of the auxiliary metal line 210 overlapping with the second electrode has a width greater than the width of the remaining portion of the auxiliary metal line 210.

Figure 5A:
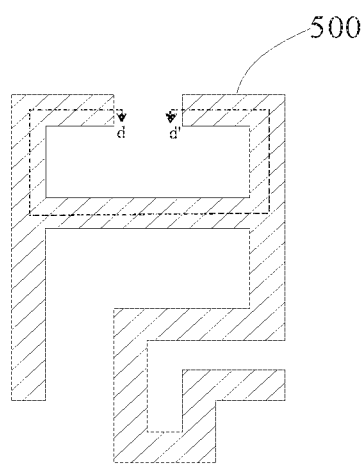
FIGS. 5A to 5K are schematic diagrams of structures at steps in a method for manufacturing a display substrate according to an embodiment of the present disclosure.

In the pixel circuit, the storage capacitor Cst stores the data voltage and the threshold voltage of the driving transistor T1, and thus, in general, the second electrode 320 of the storage capacitor Cst is electrically coupled to the gate of the driving transistor T1. In order to simplify the manufacturing process, in some embodiments, the second electrode 320 of the storage capacitor Cst may be used as the gate of the driving transistor T1, as shown in FIG. 5E. For convenience of manufacturing, the gate of each transistor and a plurality of gate lines in the display substrate are located in the third pattern layer 13.

Figure 5B:
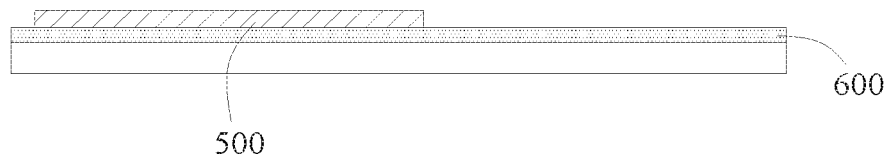
Figure 5C:
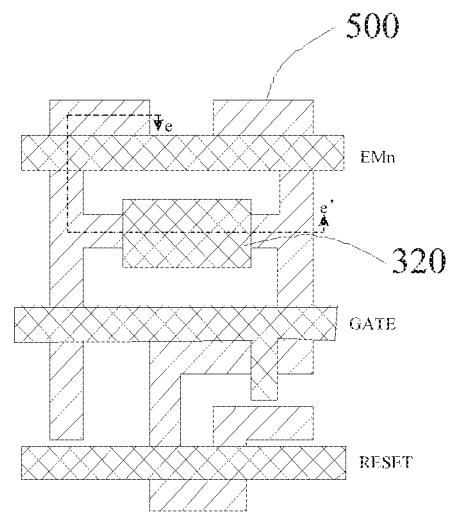
Figure 5D:
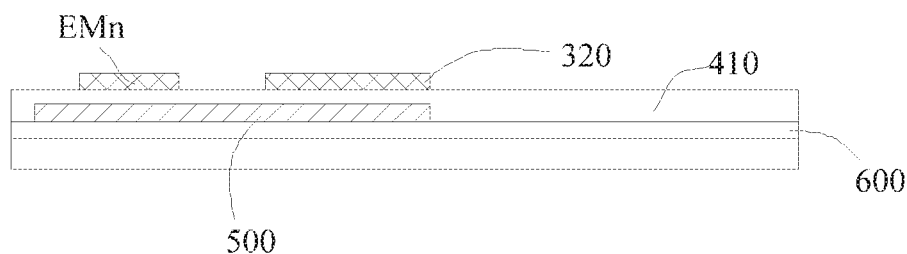
Figure 5E:
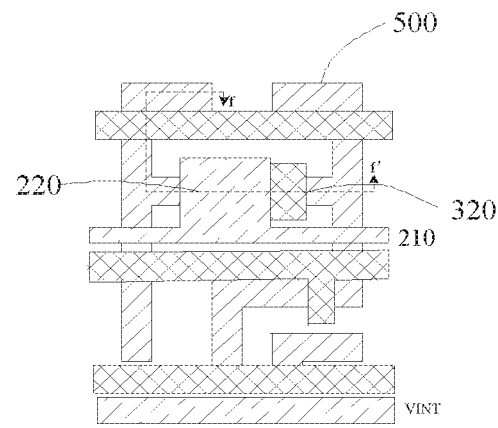
Figure 5F:
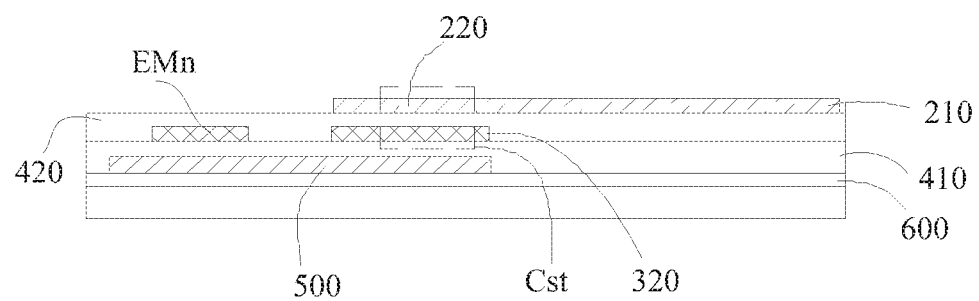
Figure 5G:
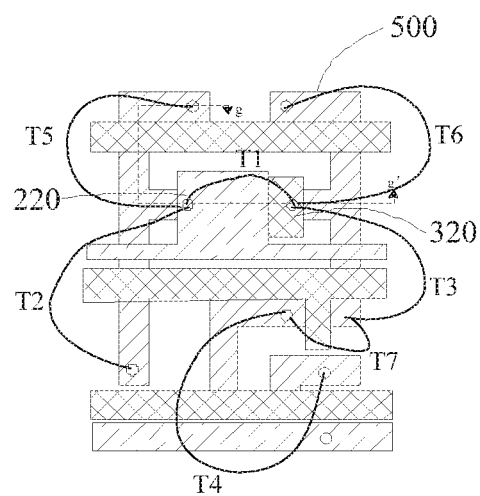

FIG. 2 is a schematic diagram of a pixel circuit, transistors of which are arranged on a display substrate in a manner shown in FIG. 5G. Specifically, the pixel circuit includes a data writing transistor T2, a first light-emitting control transistor T5, a second light-emitting control transistor T6, a reset transistor T4, and a compensation sub-circuit, in addition to the driving transistor T1 and the storage capacitor Cst described above. As described above, the second electrode 320 of the storage capacitor Cst may serve as the gate of the driving transistor T1 in the pixel unit where the storage capacitor is located, and an additional gate of the driving transistor T1 is not required.

As shown in FIG. 2, a source of the driving transistor T1 is electrically coupled to a drain of the first light-emitting control transistor T5, a gate of the driving transistor T1 is electrically coupled to a second electrode 320 of the storage capacitor Cst, and a drain of the driving transistor T1 is electrically coupled to a source of the second light-emitting control transistor T6.

A source of the first light-emitting control transistor T5 is electrically coupled to one of the at least one power line 110 through a high level signal terminal ELVDD, and a gate of the first light-emitting control transistor T5 is electrically coupled to the light-emitting control signal line EMn through a terminal Eln.

A drain of the second light-emitting control transistor T6 is electrically coupled to an anode of the organic light-emitting diode OLED, and a gate of the second light-emitting control transistor T6 is electrically coupled to the light-emitting control signal line EMn through the terminal Eln.

A source of the reset transistor T4 is electrically coupled to a reset signal line VINT through a reset signal terminal ELVINT, a drain of the reset transistor T4 is electrically coupled to the gate of the driving transistor T1, and a gate of the reset transistor T4 is electrically coupled to a reset control signal line RESET through a reset signal control terminal SLn−1. When the gate of the reset transistor T4 receives a valid reset control signal, the source of the reset transistor and the drain of the reset transistor are conductive therebetween, thereby resulting in conduction between the gate of the driving transistor T1 and the reset signal line VINT, and resetting the gate of the driving transistor T1 and the storage capacitor Cst.

A source of the data writing transistor T2 is electrically coupled to one of the plurality of data lines DATA through a data signal writing terminal DLm, a drain of the data writing transistor T2 is electrically coupled to the source of the driving transistor T1, and a gate of the data writing transistor T2 is electrically coupled to one of the plurality of gate lines GATE through a data writing control signal terminal SLn. The data writing transistor T2 is configured such that the source of the data writing transistor T2 and the drain of the data writing transistor T2 are conductive therebetween when the gate of the data writing transistor T2 receives a valid control signal, thereby writing the data voltage, written through the data signal writing terminal, into the storage capacitor Cst.

A first terminal of the compensation sub-circuit is electrically coupled to the gate of the driving transistor T1, a second terminal of the compensation sub-circuit is electrically coupled to the drain of the driving transistor T1, and a control terminal of the compensation sub-circuit is electrically coupled to the gate of the data writing transistor T2. The compensation sub-circuit may cause the gate and drain of the driving transistor T1 to be electrically coupled to each other when the control terminal of the compensation sub-circuit receives a valid control signal, so that the storage capacitor Cst stores the threshold voltage of the driving transistor T1.

In the present disclosure, a structure of the compensation sub-circuit is not particularly limited, and as shown in FIG. 2, the compensation sub-circuit may include a first compensation transistor T3 and a second compensation transistor T7. A source of the first compensation transistor T3 is electrically coupled to a drain of the second compensation transistor T7, and a drain of the first compensation transistor T3 is electrically coupled to the source of the second light-emitting control transistor T6 as the second terminal of the compensation sub-circuit. A source of the second compensation transistor T7 is electrically coupled to the gate of the driving transistor T1 as a first terminal of the compensation sub-circuit. The gate of the first compensation transistor T3 is electrically coupled to the gate of the second compensation transistor T7 and forms the control terminal of the compensation sub-circuit.

In the embodiment shown in FIG. 2, the gate of the first compensation transistor T3 and the gate of the second compensation transistor T7 are electrically coupled to the gate of the data writing transistor T2, that is, the data writing transistor T2, the first compensation transistor T3 and the second compensation transistor T7 may be controlled by a same gate line.

In one embodiment, the gate of the driving transistor T1, the gate of the data writing transistor T2, the gate of the first light-emitting control transistor T5, the gate of the second light-emitting control transistor T6, the gate of the reset transistor T4, the gate of the first compensation transistor T3, and the gate of the second compensation transistor T7 are arranged in a same layer (the third pattern layer T3).

Figure 3:
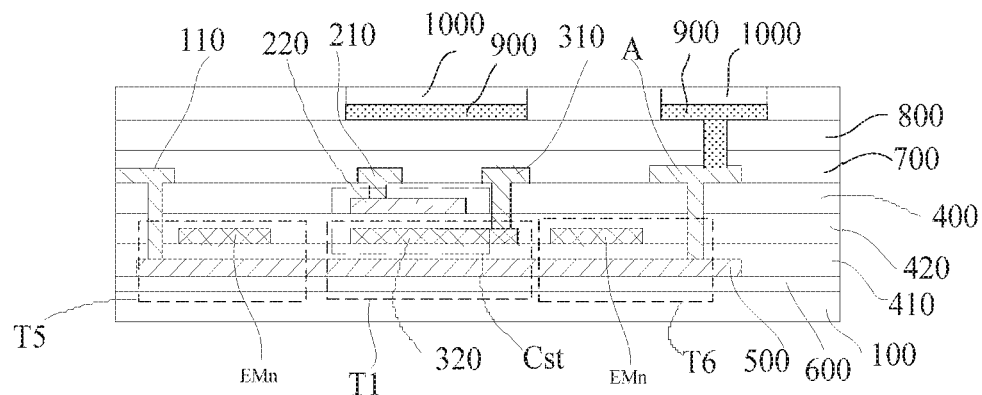
FIG. 3 is a cross-sectional view of a display substrate at positions of a light-emitting control transistor, a driving transistor, a storage capacitor according to an embodiment of the present disclosure.
Figure 4:
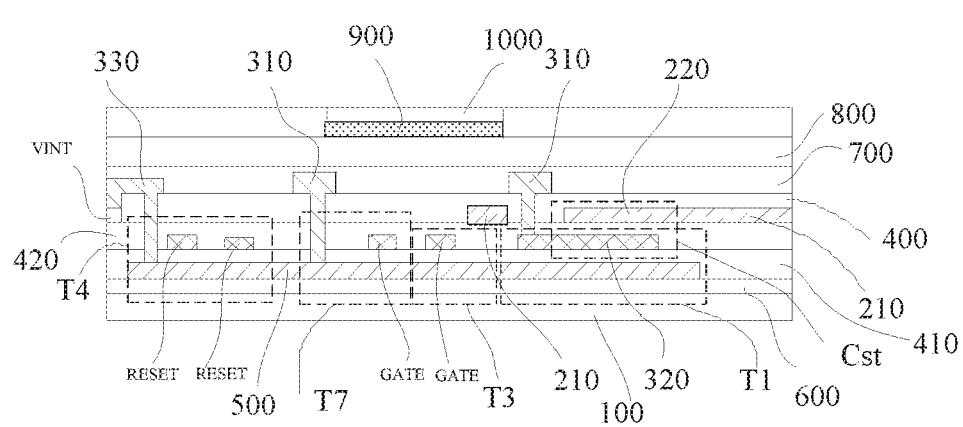
FIG. 4 is a cross-sectional view of a display substrate at positions of a reset transistor, a compensation transistor, and a driving transistor according to an embodiment of the present disclosure.
Figure 5H:
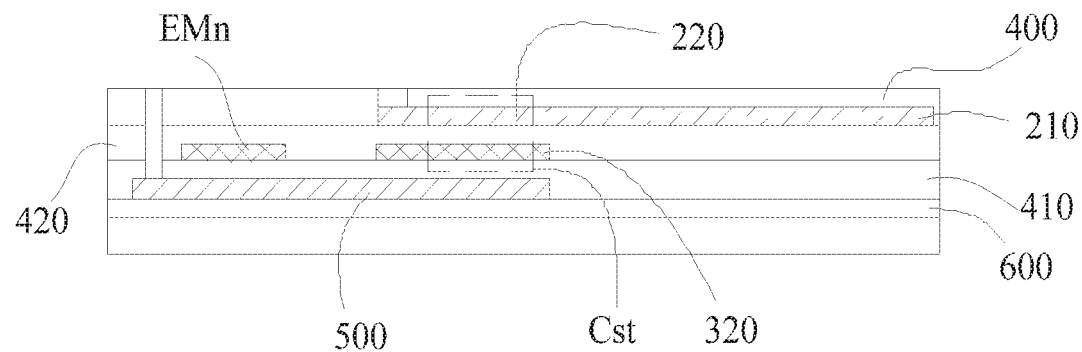
Figure 5I:
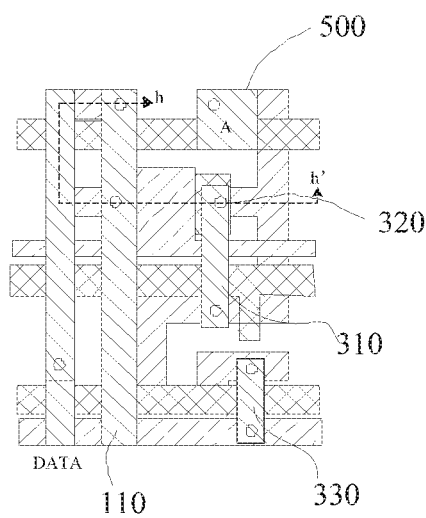
Figure 5J:
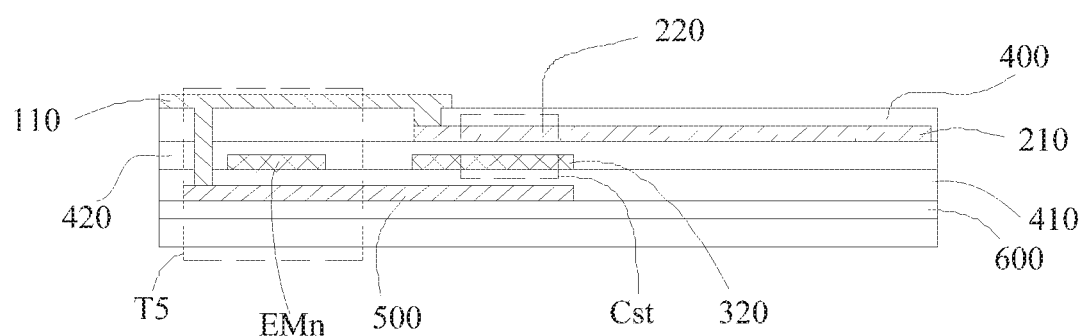
Figure 5K:
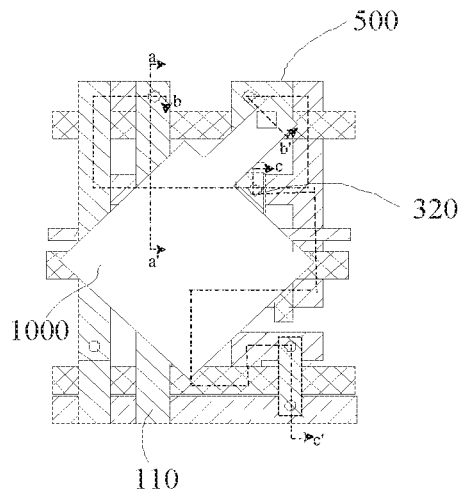

FIG. 3 is a cross-sectional view taken along a line b-b' of FIG. 5K. In the sectional view shown in FIG. 3, the first light-emitting control transistor T5, the storage capacitor Cst, and the second light-emitting control transistor T6 are partially cut. FIG. 4 is a cross-sectional view taken along the line c-c' of FIG. 5K. In the cross-sectional view shown in FIG. 4, the reset transistor T4, the first and second compensation transistors T3 and T7, and the driving transistor T1 are partially cut.

In the pixel circuit, active layers of different transistors are formed in a same layer for ease of manufacturing. The active layer of the pixel circuit is formed on the base substrate. In order to prevent impurities on the surface of the base substrate from diffusing into the active layer 500, a buffer layer 600 may be further provided between the base substrate and the active layer 500 in some embodiments.

In the present disclosure, a material of the base substrate is not particularly limited, and for example, the base substrate may be a glass substrate, or may be a flexible substrate made of a polyurethane material. The buffer layer 600 may be made of silicon oxide (SiOx) or silicon nitride (SiNx).

In the embodiments shown in FIGS. 1, 3 and 4, each of the transistors (including the first light-emitting control transistor T5, the second light-emitting control transistor T6, the reset transistor T4, the driving transistor T1, the first compensation transistor T3 and the second compensation transistor T7) in the display substrate are top gate transistors. The third pattern layer 13 is located on the first gate insulating layer 410, the first pattern layer 11 is located on the third pattern layer 13, and the second pattern layer 12 is located on the first pattern layer 11. However, the present disclosure is not limited thereto, and each transistor may be a bottom gate transistor.

As shown in FIG. 1, in one embodiment, the base substrate 100 may be made of a polyurethane material, the active layer 500 may be made of a polycrystalline silicon material, and the buffer layer 600 may be made of silicon oxide and/or silicon nitride.

As shown in FIG. 3, in some embodiments, the display substrate further includes a passivation layer 700 on the second pattern layer 12 and has a via hole extending to the drain of the second light-emitting control transistor T6. The display substrate further includes a planarization layer 800 on the passivation layer 700, and has a via hole extending to the via hole in the passivation layer 700, i.e., the via hole in the planarization layer 800 is coaxial with the via hole in the passivation layer 700 in a direction perpendicular to the base substrate. The display substrate further includes a pixel electrode 900 on the planarization layer 800, and the pixel electrode 900 is electrically coupled to the drain A of the second light-emitting control transistor T6 through the via holes in the passivation layer 700 and the planarization layer 800. The display substrate further includes an organic light-emitting diode on the pixel electrode 900.

The passivation layer 700 may be made of silicon nitride. The planarization layer 800 may be made of a polyurethane material.

As a second aspect of the present disclosure, a display device is provided, and includes a display substrate disclosed in the present disclosure.

As described above, in the display substrate, a high-level signal is provided to each pixel unit through a combined structure, with a lower resistance, of the power line and the auxiliary metal line, so that voltage drop of the high-level signal due to internal resistance in the transmission process can be reduced, the signals received by the pixel units are closer to each other, the brightness of the pixel units is more uniform, and the display effect of the display device is improved.

In the present disclosure, there is no particular requirement for the application of the display device, and for example, the display device may be a wearable device, or may be an electronic device such as a tablet computer or a navigator.

Figure 6:
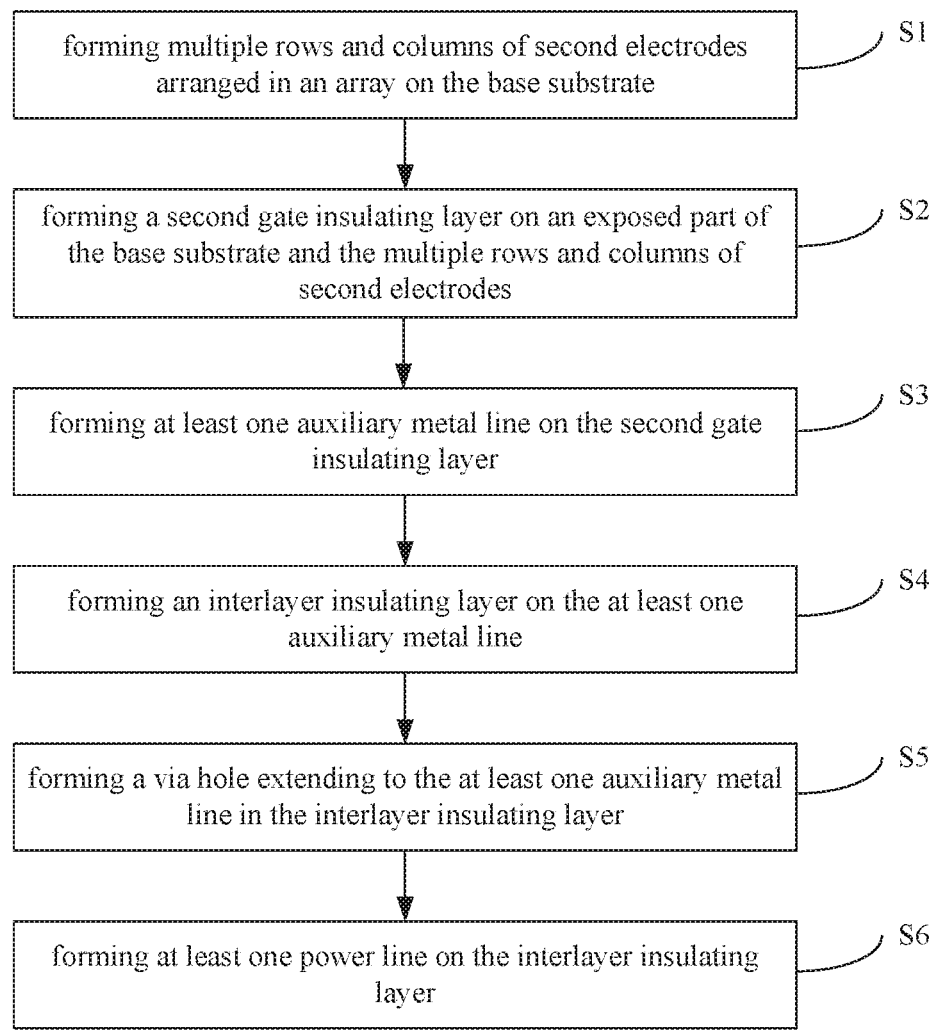
FIG. 6 is a flow chart of a method of manufacturing a display substrate according to an embodiment of the present disclosure.
Figure 7:
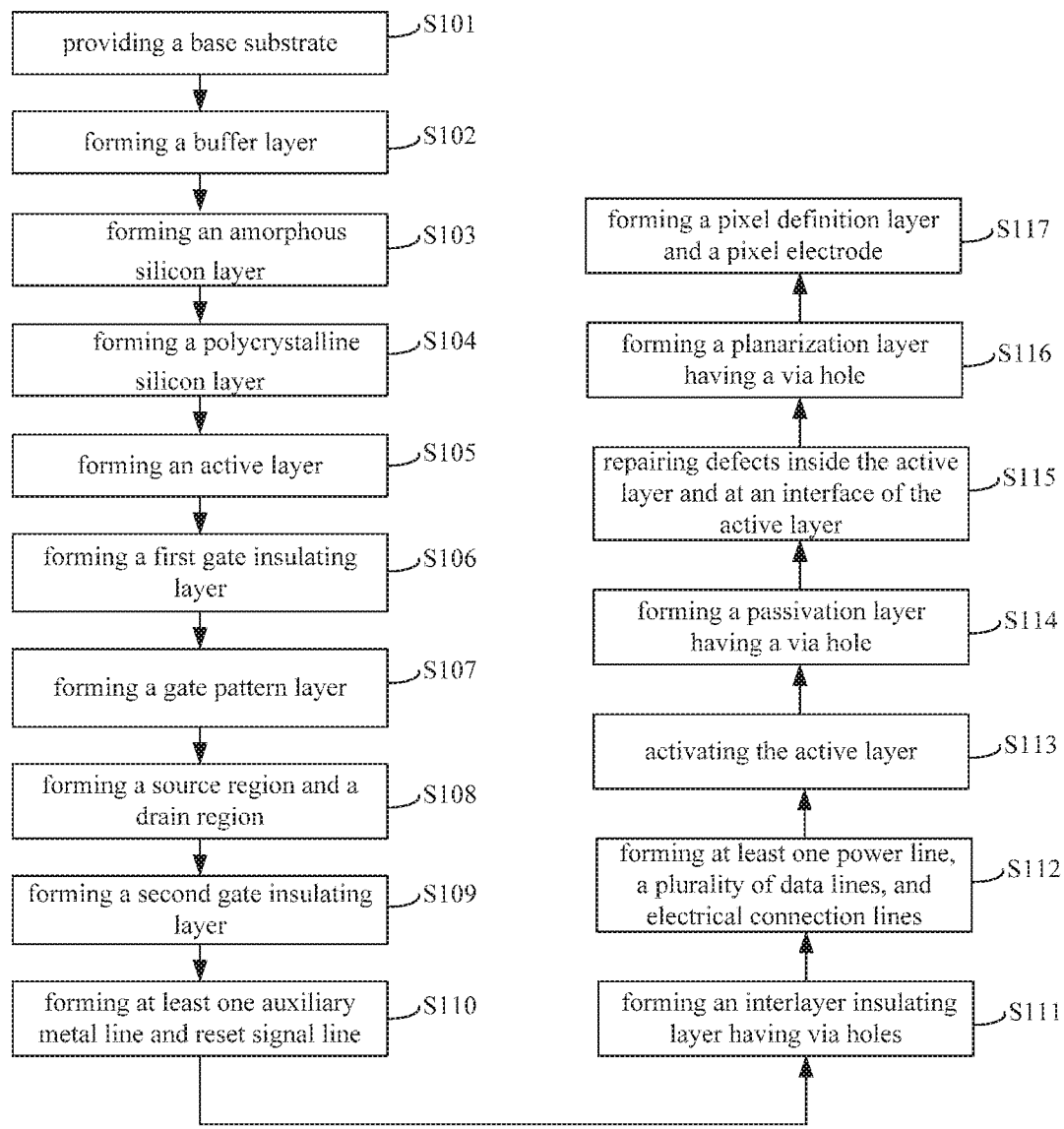
FIG. 7 is an example flow chart of a method of manufacturing a display substrate according to an embodiment of the disclosure.

A method of manufacturing a display substrate in the present disclosure is described below, and the method includes sequentially forming a third pattern layer, a first pattern layer, and a second pattern layer on a base substrate, as shown in FIG. 6. Forming the third pattern layer includes steps S1 and S2. In step S1, multiple rows and columns of second electrodes arranged in an array are formed on the base substrate. In step S2, a second gate insulating layer is formed on an exposed part of the base substrate and the multiple rows and columns of second electrodes. Forming the first pattern layer includes steps S3 to S5. In step S3, at least one auxiliary metal line is formed on the second gate insulating layer, and is arranged corresponding to one row of the second electrodes and partially overlaps with at least one second electrode in the one row of the second electrodes to form at least one storage capacitor. In step S4, an interlayer insulating layer is formed on the at least one auxiliary metal line. In step S5, a via hole extending to the at least one auxiliary metal line is formed in the interlayer insulating layer. Forming the second pattern layer includes step S6. In step S6, at least one power line is formed on the interlayer insulating layer and is electrically coupled to the at least one auxiliary metal line through a via hole in the interlayer insulating layer.

The method for manufacturing the display substrate in FIGS. 1 to 4 is described below with reference to FIGS. 5A to 5K and FIG. 7.

In S101, a base substrate 100 is provided. The base substrate may be made of a polyurethane material.

In S102, a buffer layer 600 is formed on the base substrate (as shown in FIG. 5B). By plasma enhanced chemical vapor deposition (PECVD), a silicon nitride (SiN) film and a silicon dioxide (SiO2) film are sequentially deposited on the base substrate 100 to form a buffer layer 600 including silicon nitride and silicon dioxide.

In S103, an amorphous silicon layer is formed on the buffer layer 600. An amorphous silicon (a-Si) layer is formed on the buffer layer 600 by PECVD or other chemical or physical vapor deposition methods.

In S104, the amorphous silicon layer is crystallized by an Excimer Laser Annealing (ELA) or Solid Phase Crystallization (SPC) process to form a polysilicon layer.

In S105, a first photoresist pattern is formed on the polycrystalline silicon layer, and an active layer 500 is formed by plasma etching the polycrystalline silicon layer that is not protected by the first photoresist pattern as an etching barrier layer. FIG. 5A is a top view of a display substrate having an active layer 500 (transparent layers are not shown), and FIG. 5B is a cross-sectional view taken along a line d-d' of FIG. 5A. The polycrystalline silicon active layer 500 is ion-doped at a low concentration by an ion implantation process to form a conductive channel of a thin film transistor.

In S106, a first gate insulating layer 410 is formed by depositing silicon dioxide, or silicon dioxide and silicon nitride. The photoresist on the polycrystalline silicon active layer 500 is removed through a photoresist stripping process, and SiO2, or SiO2 and SiN, is deposited by PECVD, thereby forming a first gate insulating layer 410 on the polycrystalline silicon active layer and the exposed buffer layer.

In S107, one or more low-resistance metal films are deposited on the first gate insulating layer 410 by physical vapor deposition such as magnetron sputtering, and are formed into a gate pattern layer by photolithography process. The gate pattern layer includes a light-emitting control signal line EMn, a plurality of gate lines GATE, a plurality of reset control signal lines RESET, gates of the respective transistors (not shown, including a gate of a data writing transistor T2, a gate of a first light-emitting control transistor T5, a gate of a second light-emitting control transistor T6, a gate of a reset transistor, a gate of a first compensation transistor T3, a gate of a second compensation transistor T7 in FIG. 2) and multiple rows and columns of second electrodes 320 (simultaneously serving as the gate of the driving transistor T1). FIG. 5C is a top view showing the second electrodes 320, the light-emitting control signal lines EMn, the plurality of gate lines GATE, and the reset control signal line RESET. The second electrode 320 is used as the gate of the driving transistor T1; the gates of the data writing transistor T2, the gates of the first compensation transistor T3, and the gates of the second compensation transistor T7 are electrically coupled to a same gate line of the plurality of lines GATE through a data writing control signal terminal SLn; the gates of the first and second light-emitting control transistors T5 and T6 are electrically coupled to corresponding light-emitting control signal line EMn through corresponding light-emitting control signal control terminal ELn, respectively. FIG. 5D shows a cross-sectional view taken along line e-e' of FIG. 5C. The gate pattern layer may be a single-layer metal film of Al, Cu, Mo, Ti, AlNd, or the like, or the gate pattern layer may be a multi-layer metal film of Mo/Al/Mo, Ti/Al/Ti, or the like.

In S108, the active layer 500 is ion doped by using the gates in the gate pattern layer and the second electrodes 320 as an ion implantation barrier layer. A source region and a drain region with low resistance are formed in the region where the polycrystalline silicon active layer is not blocked by the gates and the second electrodes 320. Based on the structure of the active layer 500 in FIG. 5A, a source region of the driving transistor T1, a drain region of the first light-emitting control transistor T5, and a drain region of the data writing transistor T2 can be integrally formed in the active layer 500 by ion doping; a drain region of the driving transistor T1, a source region of the second light-emitting control transistor T6, and a drain region of the first compensation transistor T3 can be integrally formed in the active layer 500 by ion doping; a drain region of the reset transistor T4 and a source region of the first compensation transistor T3 can be integrally formed in the active layer 500 by ion doping; and a source region of the first compensation transistor T3 and a drain region of the second compensation transistor T7 can be integrally formed in the active layer 500 by ion doping. The source and drain regions in the active layer 500 are respectively equivalent to the source and/or drain of the corresponding transistor, and the transistors are coupled through the source and drain regions without providing corresponding sources and drains.

In S109, a second gate insulating layer 420 is formed. A SiO2 film and a SiN film are sequentially deposited by a PECVD process to form a second gate insulating layer 420 on the entire surface including the gate pattern layer.

In S110, a plurality of auxiliary metal lines 210 and a plurality of reset signal lines VINT are formed on the second gate insulating layer 420. Each of the plurality of auxiliary metal lines 210 has a protrusion at a position corresponding to the second electrode 320, and the protrusion serves as a first electrode 220 of the storage capacitor. FIG. 5E is a top view showing the auxiliary metal line 210 and the reset signal line VINT, and FIG. 5F is a cross-sectional view taken along the line f-f' of FIG. 5E.

In S111, an interlayer insulating layer 400 is formed by sequentially depositing a silicon oxide film and a silicon nitride film, and is etched by a mask to form via holes respectively extending to the source region of the first light-emitting control transistor T5, the drain region of the second light-emitting control transistor T6, the first and second electrodes 220 and 320 of the storage capacitor, the source region of the data writing transistor T2, the source region of the second compensation transistor T7, the source region of the reset transistor T4, and the reset signal line VINT, as shown in FIG. 5G. FIG. 5H is a cross-sectional view taken along line g-g' of FIG. 5G illustrating a via hole extending to the first electrode 220 of the storage capacitor and a via hole extending to the source region of the first light-emitting control transistor T5.

In S112, a plurality of power lines 110, a plurality of data lines DATA, a drain of the second light-emitting control transistor T6, an electrical connection line 310 between the via hole extending to the second electrode 320 of the storage capacitor and the via hole extending to the source region of the second compensation transistor T7, and an electrical connection line 330 between the via hole extending to the source region of the reset transistor T4 and the via hole extending to the reset signal line VINT are formed on the interlayer insulating layer 400. One or more low-resistance metal films are deposited on the interlayer insulating layer 400 by a magnetron sputtering process, and is etched by a mask to form a plurality of power lines 110, a plurality of data lines DATA, and a drain a of the second light-emitting control transistor T6, such that one of the plurality of power lines 110, which is electrically coupled to one of the plurality of auxiliary metal lines 210, is electrically coupled to a source of the first light-emitting control transistor T5 through a via hole, one of the plurality of data lines DATA is electrically coupled to a source region of the data writing transistor T2 through a via hole, the second electrode of the storage capacitor 320 is electrically coupled to a source region of the second compensation transistor T7 through an electrical connection line, and a source region of the reset transistor T4 is electrically coupled to a reset signal line VINT through an electrical connection line. The metal film, forming the plurality of power lines 110, the plurality of data lines DATA, the drain of the second light-emitting control transistor T6, an electrical connection line between the via hole extending to the second electrode of the storage capacitor 320 and the via hole extending to the source region of the second compensation transistor T7, and an electrical connection line between the via hole extending to the source region of the reset transistor T4 and the via hole extending to the reset signal line VINT, may be a single-layer metal film of Al, Cu, Mo, Ti, AlNd, or the like, or a multi-layer metal film of Mo/Al/Mo, Ti/Al/Ti, or the like. FIG. 5I is a top view showing the power line 110, the data line DATA, and the drain A of the second light-emitting control transistor T6, and FIG. 5J is a cross-sectional view taken along line h-h' of FIG. 5I.

In S113, the doped ions in the active layer 500 is activated by rapid thermal annealing or heat treatment furnace annealing, so that an effective conductive channel is formed in the active layer 500 under the gates.

In S114, a silicon nitride film is deposited on the entire surface of the base substrate including the power line 110, the data line DATA, and the drain A of the second light-emitting control transistor T6, and is etched by a mask to form a passivation layer 700 including a via hole extending to an anode of the organic light-emitting diode to be formed. The via hole in the passivation layer 700 extends to the drain A of the second emission control transistor T6.

In S115, a hydrogenation process is performed by a rapid thermal annealing or heat treatment furnace annealing process to repair defects inside the active layer 500 and at an interface of the active layer 500.

In S116, an organic planarization layer 800 having a via hole with a same vertical axis as the via hole of the anode is formed on the passivation layer 700 through a mask process to fill recesses in a surface of a resultant device to form a flat surface. The via hole in the planarization layer 800 extends to the via hole in the passivation layer 700.

In S117, a transparent conductive film is deposited on the organic planarization layer 800 by magnetron sputtering, and is etched through a photolithography process to form a pixel electrode 900 in a pixel region over the via hole in the organic planarization layer 800 and a portion of the organic planarization layer 800, as shown in FIG. 5K. Then, a layer of photosensitive organic material similar to the material of the organic planarization layer is coated on the exposed organic planarization layer and the pixel electrode, and a partial area of the pixel electrode is exposed through a last mask process to form a pixel definition layer 1000. The pixel definition layer covers the organic planarization layer and a part of the pixel electrode area. The transparent conductive film can be a single-layer oxide conductive film, such as ITO or IZO, or a composite film of ITO/Ag/ITO, IZO/Ag, etc.

The display substrate in the present disclosure can be obtained by 8 to 9 mask processes. After the display substrate in the present disclosure is obtained, each functional layer of the organic light-emitting diode may be formed on the display substrate. The display substrate is encapsulated, so that a display panel may be obtained.

It can be understood that the above embodiments are merely exemplary embodiments adopted to explain the principles of the present disclosure, but the present disclosure is not limited thereto. For those of ordinary skill in the art, various variations and improvements can be made without departing from the spirit and essence of the present disclosure, and these variations and improvements are also considered to be within the protection scope of the present disclosure.

What is claimed is:

1. A display substrate, comprising:
    a base substrate; and
    a first pattern layer, a second pattern layer and a third pattern layer on the base substrate,
    wherein the third pattern layer is arranged on the base substrate, the first pattern layer is arranged on the third pattern layer, and the second pattern layer is arranged on the first pattern layer,
    the first pattern layer comprises at least one auxiliary metal line, the second pattern layer comprises at least one power line, and the third pattern layer comprises multiple rows and columns of second electrodes arranged in an array, and
    one auxiliary metal line of the at least one auxiliary metal line is arranged corresponding to one row of the multiple rows and columns of second electrodes and partially overlaps with at least one of the second electrodes in the one row to form at least one storage capacitor, and the one auxiliary metal line is electrically coupled to the at least one power line through a via hole at a position where the one auxiliary metal line partially overlaps with the at least one second electrode.

2. The display substrate of claim 1, wherein a width of an overlapping portion of the auxiliary metal line overlapping with the second electrode is larger than a width of a remaining portion of the auxiliary metal line except the overlapping portion, and the overlapping portion serves as a first electrode of the storage capacitor.

3. The display substrate of claim 2, wherein the auxiliary metal line has a protrusion at a position corresponding to the second electrode, and the protrusion serves as the first electrode of the storage capacitor.

4. The display substrate of claim 3, wherein an extending direction of the at least one power line is parallel to a column direction of the multiple rows and columns of second electrodes, an extending direction of the at least one auxiliary metal line is parallel to a row direction of the multiple rows and columns of second electrodes, and
the extending direction of the at least one power line is perpendicular to the extending direction of the at least one auxiliary metal line.

5. The display substrate of claim 2, wherein the second pattern layer further comprises a plurality of data lines, the third pattern layer further comprises a plurality of gate lines, an extending direction of the at least one power line is parallel to an extending direction of the plurality of data lines, and
an extending direction of the at least one auxiliary metal line is parallel to an extending direction of the plurality of gate lines.

6. The display substrate of claim 1, wherein the second pattern layer further comprises a plurality of data lines, the third pattern layer further comprises a plurality of gate lines, an extending direction of the at least one power line is parallel to an extending direction of the plurality of data lines, and
an extending direction of the at least one auxiliary metal line is parallel to an extending direction of the plurality of gate lines.

7. The display substrate of claim 6, wherein the first pattern layer further comprises at least one reset signal line arranged in a same layer as the at least one auxiliary metal line.

8. The display substrate of claim 7, wherein the first pattern layer further comprises an interlayer insulating layer arranged on the at least one auxiliary metal line, and each of the at least one auxiliary metal line is electrically coupled to the at least one power line through a via hole in the interlayer insulating layer.

9. The display substrate of claim 8, wherein the at least one power line and the plurality of data lines in the second pattern layer are arranged on the interlayer insulating layer.

10. The display substrate of claim 9, wherein the third pattern layer further comprises:
a second gate insulating layer on the multiple rows and columns of second electrodes and the plurality of gate lines, the at least one auxiliary metal line being arranged on the second gate insulating layer.

11. The display substrate of claim 10, further comprising:
an active layer arranged on the base substrate; and
a first gate insulating layer arranged on the active layer and a part of the base substrate which is not provided with the active layer, the multiple rows and columns of second electrodes and the plurality of gate lines being arranged on the first gate insulating layer.

12. The display substrate of claim 11, wherein the display substrate is divided into a plurality of pixel units by the multiple rows and columns of second electrodes arranged in an array, the at least one auxiliary metal line comprises a plurality of auxiliary metal lines, the at least one power line comprises a plurality of power lines, the plurality of auxiliary metal lines are respectively electrically coupled to the plurality of power lines through via holes, and the plurality of auxiliary metal lines are respectively arranged corresponding to the multiple rows of second electrodes and partially overlap with each of second electrodes in the corresponding rows of second electrodes to form a plurality of storage capacitors,
each of the plurality of pixel units is provided therein with a pixel circuit and an organic light-emitting diode, the pixel circuit comprises a driving transistor, a data writing transistor, a first light-emitting control transistor, a second light-emitting control transistor, a reset transistor, a compensation sub-circuit, and a storage capacitor of the plurality of storage capacitors, a second electrode of the storage capacitor being a gate of the driving transistor in the pixel unit in which the storage capacitor is located, wherein
a source of the driving transistor is electrically coupled to a drain of the first light-emitting control transistor, and a drain of the driving transistor is electrically coupled to a source of the second light-emitting control transistor;
a source of the first light-emitting control transistor is electrically coupled to one of the plurality of power lines, and the gate of the first light-emitting control transistor is electrically coupled to a light-emitting control signal line;
a drain of the second light-emitting control transistor is electrically coupled to an anode of the organic light-emitting diode, and a gate of the second light-emitting control transistor is electrically coupled to the light-emitting control signal line;
a source of the reset transistor is electrically coupled to the reset signal line, a drain of the reset transistor is electrically coupled to the gate electrode of the driving transistor, and the gate of the reset transistor is electrically coupled to a reset control signal line;
a source of the data writing transistor is electrically coupled to one of the plurality of data lines, a drain of the data writing transistor is electrically coupled to the source of the driving transistor, a gate of the data writing transistor is electrically coupled to one of the plurality of gate lines, and the data writing transistor is configured to be conductive between the source and drain of the data writing transistor when the gate of the data writing transistor receives a valid control signal;
a first terminal of the compensation sub-circuit is electrically coupled to the gate of the driving transistor, a second terminal of the compensation sub-circuit is electrically coupled to the drain of the driving transistor, a control terminal of the compensation sub-circuit is electrically coupled to the gate of the data writing transistor, and the compensation sub-circuit is configured to cause the drain and the gate of the driving transistor to be electrically coupled to each other when the control terminal of the compensation sub-circuit receives a valid control signal, so that the storage capacitor stores a threshold voltage of the driving transistor.

13. The display substrate of claim 12, wherein the compensation sub-circuit comprises a first compensation transistor and a second compensation transistor, wherein
a gate of the first compensation transistor is electrically coupled to a gate of the second compensation transistor, and serves as the control terminal of the compensation sub-circuit;
a source of the first compensation transistor is electrically coupled to a drain of the second compensation transistor, a drain of the first compensation transistor serves as the second terminal of the compensation sub-circuit and is electrically coupled to the drain of the driving transistor, and a source of the second compensation transistor serves as the first terminal of the compensation sub-circuit and is electrically coupled to the gate of the driving transistor.

14. The display substrate of claim 13, further comprising a buffer layer formed on the base substrate, the active layer being formed on the buffer layer.

15. The display substrate of claim 14, wherein the base substrate is made of a polyurethane material, the active layer is made of a polycrystalline silicon material, and the buffer layer is made of silicon oxide and/or silicon nitride.

16. A display device comprising the display substrate of claim 1.

17. A method for manufacturing a display substrate, the display substrate comprising a third pattern layer, a first pattern layer and a second pattern layer sequentially arranged on a base substrate, wherein the method comprises:
   forming the third pattern layer comprising:
     forming multiple rows and columns of second electrodes arranged in an array on the base substrate; and
     forming a second gate insulating layer on the multiple rows and columns of second electrodes and on a part of the base substrate exposed by the multiple rows and columns of second electrodes,
   forming the first pattern layer comprising:
     forming at least one auxiliary metal line on the second gate insulating layer, such that one auxiliary metal line of the at least one auxiliary metal line is arranged corresponding to one row of the multiple rows and columns of second electrodes and partially overlaps with at least one of the second electrodes in the one row to form at least one storage capacitor;
     forming an interlayer insulating layer on the at least one auxiliary metal line; and
       forming a via hole extending to the at least one auxiliary metal line in the interlayer insulating layer,
   forming the second pattern layer comprising:
     forming at least one power line on the interlayer insulating layer, such that the at least one power line is electrically coupled to the at least one auxiliary metal line through the via hole in the interlayer insulating layer at a position where the one auxiliary metal line partially overlaps with the at least one second electrode.

18. The method of claim 17, wherein
   before the forming the third pattern layer, the method further comprises:
     forming an active layer on the base substrate;
     forming a first gate insulating layer on the active layer and a part of the base substrate exposed by the active layer, the multiple rows and columns of second electrodes arranged in an array being formed on the first gate insulating layer, and
   the forming the first pattern layer further comprises:
     forming at least one reset signal line while forming the at least one auxiliary metal line.

19. The method of claim 18, wherein the display substrate is divided into a plurality of pixel units by the multiple rows and columns of second electrodes arranged in an array, each of the plurality of pixel units comprises a pixel circuit and an organic light-emitting diode, the pixel circuit comprises a driving transistor, a data writing transistor, a first light-emitting control transistor, a second light-emitting control transistor, a reset transistor, a first compensation transistor, a second compensation transistor, and one of the at least one storage capacitor, wherein
   the forming the third pattern layer further comprises:
     while forming the multiple rows and columns of second electrodes arranged in an array on the first gate insulating layer, forming a gate of the data writing transistor, a gate of the first light-emitting control transistor, a gate of the second light-emitting control transistor, a gate of the reset transistor, a gate of the first compensation transistor, a gate of the second compensation transistor, a plurality of gate lines, a light-emitting control signal line, and a reset control signal line on the first gate insulating layer, wherein a second electrode of the storage capacitor serves as a gate of the driving transistor, such that the gate of the data writing transistor, the gate of the first compensation transistor, and the gate of the second compensation transistor are all electrically coupled to a same gate line among the plurality of gate lines, the gate of the first light-emitting control transistor and the gate of the second light-emitting control transistor are respectively electrically coupled to the light-emitting control signal line; and
   performing an ion-doping process on the active layer to form source and drain regions of each of the driving transistor, the data writing transistor, the first compensation transistor, the second compensation transistor, the first light-emitting control transistor and the second light-emitting control transistor in a region of the active layer not blocked by using the gates of the driving transistor, the data writing transistor, the first compensation transistor, the second compensation transistor, the first light-emitting control transistor and the second light-emitting control transistor and the multiple rows and columns of second electrodes as an ion implantation barrier layer,
   wherein a source region of the driving transistor, a drain region of the first light-emitting control transistor, and a drain region of the data writing transistor are integrally formed in the active layer as a single piece;
   a drain region of the driving transistor, a source region of the second light-emitting control transistor, and a drain region of the first compensation transistor are integrally formed in the active layer as a single piece;
   a drain region of the reset transistor and a source region of the second compensation transistor are integrally formed in the active layer as a single piece; and
   a source region of the first compensation transistor and a drain region of the second compensation transistor are integrally formed in the active layer as a single piece.

20. The method of claim 19, wherein the forming the second pattern layer further comprises:
   forming via holes respectively extending to a source region of the first light-emitting control transistor, a drain region of the second light-emitting control transistor, the second electrode of the storage capacitor, a source region of the data writing transistor, the source region of the second compensation transistor, a source region of the reset transistor, and the reset signal line in the interlayer insulating layer; and
   while the forming the at least one power line on the interlayer insulating layer, forming a drain of the second light-emitting control transistor, a plurality of data lines, an electrical connection line between a via hole extending to the second electrode of the storage capacitor and a via hole extending to the source region of the second compensation transistor, and an electrical connection line between a via hole extending to a source region of the reset transistor and a via hole extending to the reset signal line, such that one of the at least one power line, which is electrically coupled to one of the at least one auxiliary metal line, is electrically coupled to the source region of the first light-emitting control transistor through the via hole in the interlayer insulating layer.

* * * * *